(12) United States Patent
Iri et al.

(10) Patent No.: US 9,832,864 B2
(45) Date of Patent: Nov. 28, 2017

(54) CIRCUIT BOARD AND LIQUID EJECTION HEAD

(71) Applicant: CANON KABUSHIKI KAISHA, Tokyo (JP)

(72) Inventors: Junichiro Iri, Yokohama (JP); Ryo Sato, Yokohama (JP); Kazuhiro Idogawa, Fukushima (JP); Chiaki Muraoka, Kawaguchi (JP); Hiromasa Amma, Kawasaki (JP); Takuya Iwano, Inagi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/161,731

(22) Filed: May 23, 2016

(65) Prior Publication Data
US 2016/0353565 A1    Dec. 1, 2016

(30) Foreign Application Priority Data

May 27, 2015    (JP) .................................. 2015-107297

(51) Int. Cl.
| | |
|---|---|
| *H05K 1/02* | (2006.01) |
| *B41J 2/175* | (2006.01) |
| *B41J 2/14* | (2006.01) |
| *H05K 3/00* | (2006.01) |

(52) U.S. Cl.
CPC ................ *H05K 1/028* (2013.01); *B41J 2/14* (2013.01); *B41J 2/1753* (2013.01); *B41J 2/17553* (2013.01); *H05K 1/0296* (2013.01); *H05K 3/0058* (2013.01); *H05K 2201/0979* (2013.01); *H05K 2201/09227* (2013.01); *H05K 2201/09254* (2013.01); *H05K 2201/09272* (2013.01); *H05K 2201/09663* (2013.01); *H05K 2201/09727* (2013.01)

(58) Field of Classification Search
CPC ..... H05K 2201/05; H05K 2201/09227; H05K 2201/09254; H05K 2201/09245; H05K 2201/09272; H05K 2201/09663; H05K 2201/09727; H05K 2201/0979; H05K 1/028; H05K 1/18–1/189; H05K 1/0296; H05K 3/0058; H05K 3/326; H05K 3/36; H05K 3/361; H05K 3/4635; B41J 2/14; B41J 2/1753; B41J 2/17553

See application file for complete search history.

(56) References Cited

U.S. PATENT DOCUMENTS

| | | | |
|---|---|---|---|
| 5,717,556 A | * | 2/1998 | Yanagida ............. H05K 1/0278 174/254 |
| 6,802,595 B2 | | 10/2004 | Mizutani |
| 9,238,361 B2 | | 1/2016 | Muraoka et al. |

(Continued)

FOREIGN PATENT DOCUMENTS

JP    2003-072042 A    3/2003

OTHER PUBLICATIONS

Extended European Search Report dated Oct. 7, 2016, in European Patent Application No. 16001184.7.

*Primary Examiner* — Geoffrey Mruk
*Assistant Examiner* — Scott A Richmond
(74) *Attorney, Agent, or Firm* — Fitzpatrick, Cella, Harper & Scinto

(57) ABSTRACT

A liquid ejection head includes a circuit board having a wire pattern divided into a plurality of portions in order to provide the circuit board with very reliable bonding.

11 Claims, 12 Drawing Sheets

(56) References Cited

U.S. PATENT DOCUMENTS

| | | | |
|---|---|---|---|
| 2001/0033355 A1 | 10/2001 | Hagiwara | |
| 2003/0043236 A1* | 3/2003 | Mizutani | B41J 2/14072 347/58 |
| 2006/0076158 A1* | 4/2006 | Umeyama | B41J 2/17526 174/254 |
| 2006/0244741 A1* | 11/2006 | Kimura | G02F 1/13452 345/204 |
| 2008/0050982 A1* | 2/2008 | Kaneko | G01R 31/2818 439/721 |
| 2008/0117376 A1* | 5/2008 | Takenaka | H05K 1/028 349/152 |

* cited by examiner

CIRCUIT BOARD AND LIQUID EJECTION HEAD

BACKGROUND OF THE INVENTION

Field of the Invention

The present invention relates to a circuit board including a plurality of terminals for connection to electric components and a liquid ejection head including the circuit board.

Description of the Related Art

As a circuit board of this kind, Japanese Patent Laid-Open No. 2003-72042 describes a flexible circuit board connected to a printing element substrate in an ink jet print head (liquid ejection head). The circuit board is bonded on a support substrate that supports the printing element substrate and assembled to the print head along with the printing element substrate and the support substrate. Such a circuit board is provided with a plurality of inner terminals connected to respective plurality of electrodes on the printing element substrate, a plurality of outer terminals connected to a circuit in a main body of a printing apparatus, and wire patterns that connect the inner terminals and the corresponding outer terminals together.

The circuit board is bonded, with an adhesive, to the support substrate via an insulation layer positioned on the wire pattern. A surface of the insulation layer slightly undulates according to the shape of the wire patterns, and the adhesive bonds the undulating surface of the insulation layer to a surface of the support substrate. Thus, when the circuit board is bonded to the support substrate, a space between the circuit board and the support substrate that holds the adhesive is narrower at portions of the adhesive applied to areas where the wire pattern is present than at portions of the adhesive applied to areas where the wire pattern is not present. As a result, each of the former portions of the adhesive tends to be spread out to the corresponding areas where the wire pattern is not present. Furthermore, in these bonding areas, flow resistance of the adhesive may vary according to the undulating shape of the insulation layer, leading to uneven spread of the adhesive. Consequently, in the bonding area where the adhesive is likely to spread, the adhesive may leak to the exterior, whereas, in the bonding area where the adhesive is unlikely to spread, inappropriate bonding may occur. In Japanese Patent Laid-Open No. 2003-72042, such uneven spread of the adhesive is not taken into account.

SUMMARY OF THE INVENTION

The present invention provides a circuit board for which very reliable bonding can be achieved and a liquid ejection head including the circuit board.

In a first aspect of the present invention, there is provided a circuit board including a plurality of connection terminals arranged along a first direction and a plurality of wire patterns connected to the respective plurality of connection terminals, a surface of the circuit board with the plurality of wire patterns formed thereon being bonded to a support member with an adhesive, wherein each of the plurality of wire patterns includes a first portion extending from the connection terminal in a second direction crossing the first direction and a second portion extending after being bent from the first portion, and the second portion of at least one of the plurality of wire patterns is divided into a plurality of portions in a width direction crossing a direction in which the second portion extends.

In a second aspect of the present invention, there is provided a liquid ejection head enabled to eject a liquid, the liquid ejection head comprising a circuit board and element substrate, wherein the circuit board includes a plurality of connection terminals arranged along a first direction and a plurality of wire patterns connected to the respective plurality of connection terminals, a surface of the circuit board with the plurality of wire patterns formed thereon being bonded to a support member with an adhesive, each of the plurality of wire patterns includes a first portion extending from the connection terminal in a second direction crossing the first direction and a second portion extending after being bent from the first portion, the second portion of at least one of the plurality of wire patterns is divided into a plurality of portions in a width direction crossing a direction in which the second portion extends, and the element substrate includes a plurality of electrode terminals connected to the plurality of connection terminals on the circuit board.

In the present invention, each of the wire patterns is provided with a portion divided into a plurality of portions to make the widths of the resultant wire patterns substantially uniform. Thus, a portion of the adhesive spread out by the wire pattern is held in the area where no wire pattern is present, allowing the adhesive to be substantially evenly spread. As a result, possible leakage of the adhesive and inappropriate bonding are inhibited, enabling very reliable bonding of the circuit board.

Further features of the present invention will become apparent from the following description of exemplary embodiments (with reference to the attached drawings).

DESCRIPTION OF THE EMBODIMENTS

Embodiments of the present invention will be described below based on the drawings.

First Embodiment

A circuit board in the present embodiment is an application example in which the circuit board serves as a flexible circuit board 20 included in an ink jet print head (liquid ejection head) 10. First, a basic configuration of the present embodiment will be described based on FIGS. 1 to 3B.
(Basic Configuration)

Figure 1:
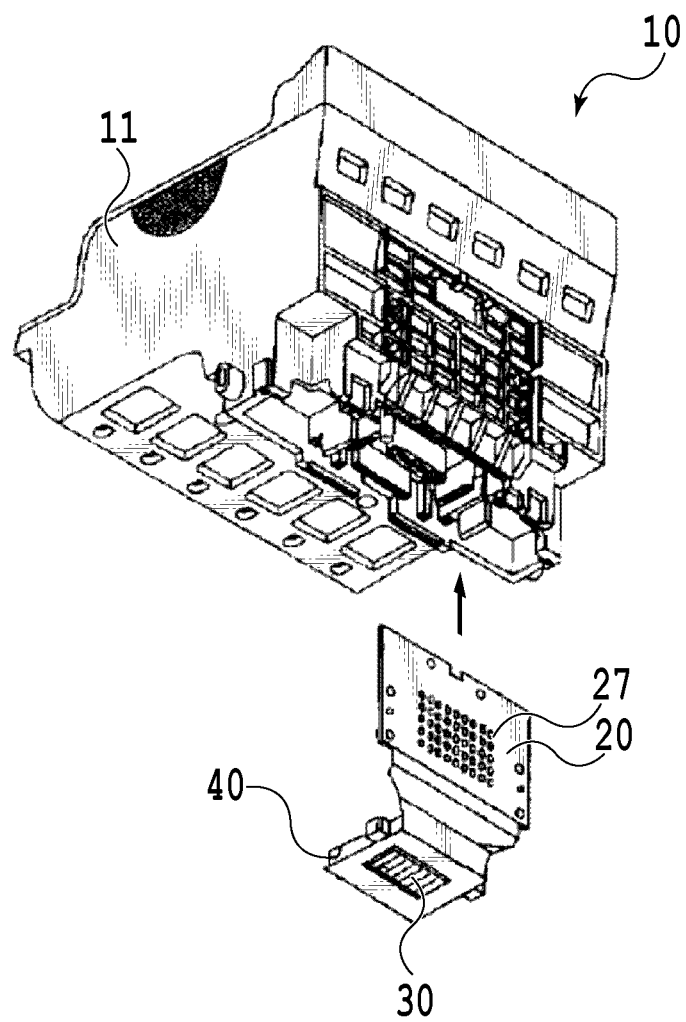
FIG. 1 is an exploded perspective view of a print head to which the present invention is applicable.
Figure 2:
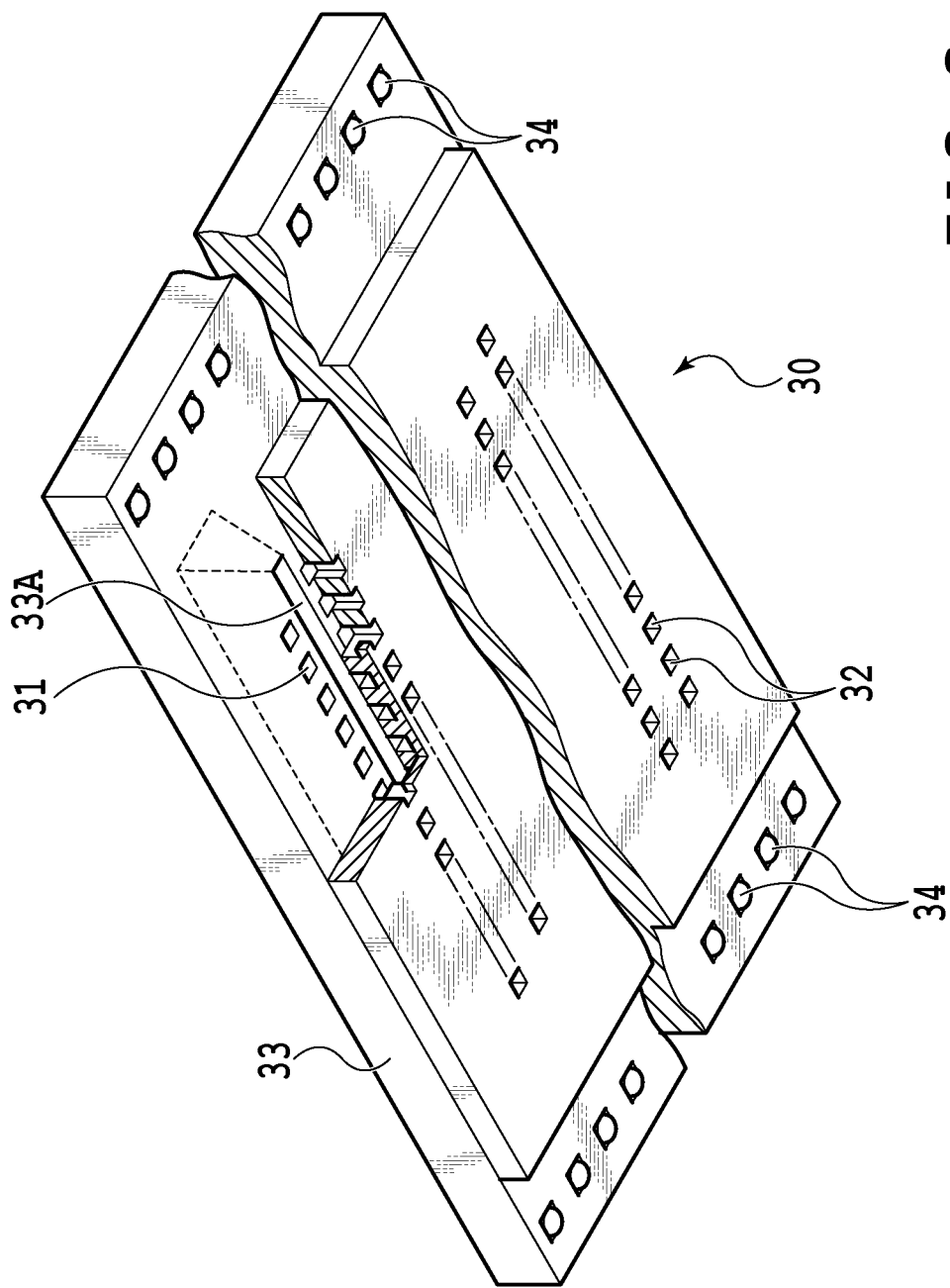
FIG. 2 is a partially cutaway enlarged perspective view of a printing element substrate in FIG. 1.

FIG. 1 is an exploded perspective view of the ink jet print head 10 serving as a liquid ejection head that enables ink (liquid) to be ejected. Ink tanks not depicted in the drawings are removably installed on a head main body 11. A support member 40 to which a circuit board 20 and a printing element substrate 30 are attached is assembled to the head main body 11. FIG. 2 is a perspective view of the printing element substrate 30.

The printing element substrate 30 includes a plurality of printing elements (liquid ejection elements) that enables ink to be ejected. Each of the printing elements includes an ejection energy generating element such as an electrothermal transducing element (heater) or a piezo element to eject ink through ejection ports 32. When the electrothermal transducing elements are used, the electrothermal transducing elements can generate heat to bubble the ink and eject the ink through the ejection port utilizing the energy of the bubbles. In the present example, electrothermal transducing elements 31 are used as the ejection energy generating elements. Ink in the ink tanks is fed to the printing elements through channels in the head main body 11 that are not depicted in the drawings and an ink channel 33A in a silicon substrate 33 in the printing element substrate 30. The ejection ports 32 are arranged so as to form an ejection port array. The silicon substrate 33 is provided with electrode terminals (bumps) 34 electrically connected to the electrothermal transducing elements 31.

Figure 3A:
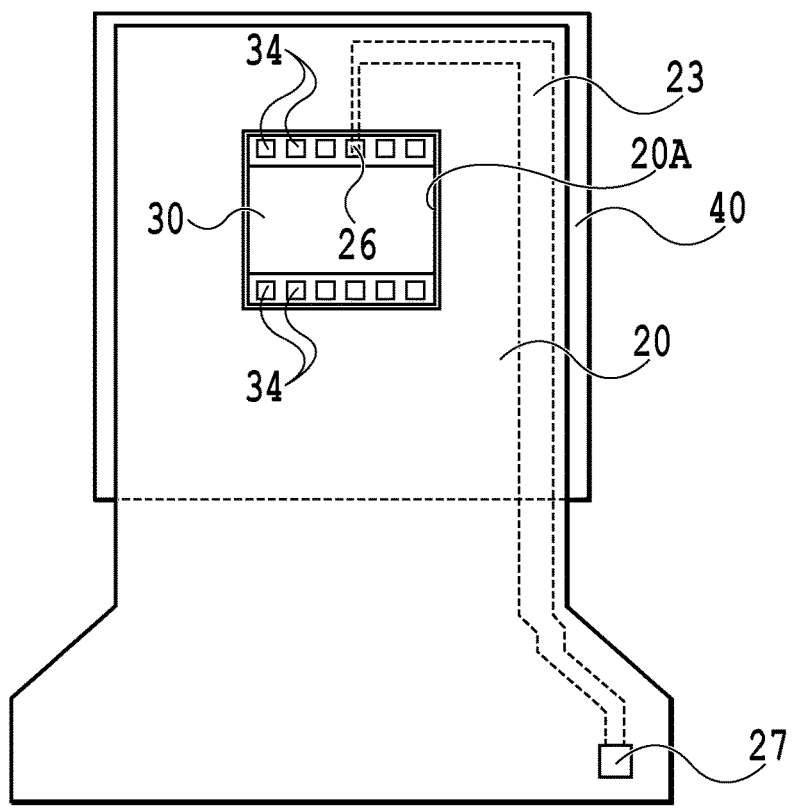
FIG. 3A and FIG. 3B are diagrams illustrating a basic configuration of a circuit board.
Figure 3B:
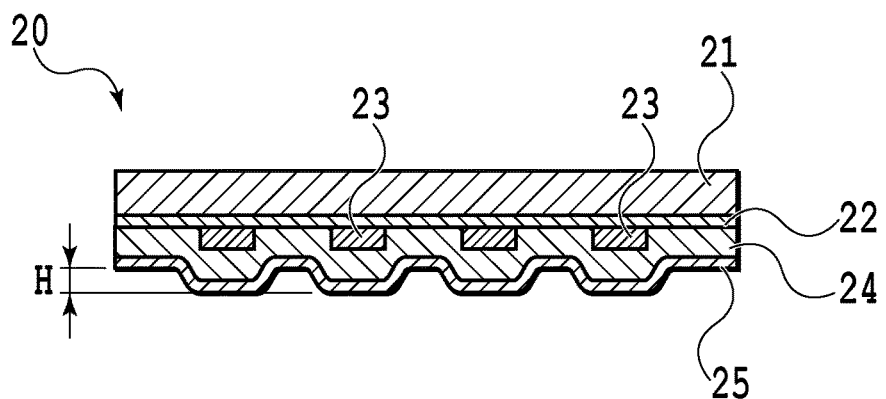

FIG. 3A and FIG. 3B are schematic configuration diagrams of the circuit board 20. The circuit board 20 in the present example includes a layer of a base film adhesive 22 formed on a base film 21 such as polyimide and wire patterns 23 formed on the base film adhesive 22. Moreover, a cover film adhesive 24 is used for bonding of a cover film (insulation layer) 25 so as to cover the wire patterns 23 with the cover film (insulation layer) 25. Thus, a surface of the cover film 25 slightly undulates according to the shape of the wire patterns 23. In the present example, the height H of the undulation is approximately 10 μm to approximately 20 μm.

An opening (device hole) 20A is formed in the circuit board 20 so that the printing element substrate 30 can be assembled into the circuit board 20. At an edge of the opening 20A, inner connection terminals 26 are provided which are connected to the respective electrode terminals 34 of the printing element substrate 30. The connection terminals 26 in the present example are arranged along an upper limit edge, in FIG. 3A, of the opening 20A so as to lie opposite to the plurality of electrode terminals 34 of the printing element substrate 30. The circuit board 20 is also provided with outer connection terminals 27 that allow signals to be transmitted to and received from the main body of the printing apparatus. The connection terminals 26 and the connection terminals 27 are connected together via the wire patterns 23. The wire patterns include patterns forming signal lines through which a relatively small current flows and patterns forming a power line and a ground line through which a relatively large current flows to drive the electrothermal transducing elements 31. The connection terminals 26 and the connection terminals 27 in the circuit board 20 include terminals corresponding to the wire patterns 23, in other words, terminals through which the relatively small current flows and terminals through which the relatively large current flows. The numbers of the connection terminals 26 in the circuit board 20 and the corresponding electrode terminals 34 of the electrothermal transducing elements 31 are each several tens to several hundreds. The connection terminals 26 and the electrode terminals 34 are arranged at a pitch of approximately 100 μm to approximately 500 μm.

The printing element substrate 30 is positionally accurately bonded and fixed to the support member 40. An adhesive used for bonding of the printing element substrate 30 is applied onto the support member 40. The circuit board 20 is similarly bonded and fixed to the support member 40 with the adhesive. The adhesive bonds the slightly undulating surface of the cover film 25 in the circuit board 20 to a surface of the support member 40. The printing element substrate 30 and the circuit board 20 are bonded to the support member 40 so as to allow the electrode terminals 34 and the connection terminals 26 to be planarly connected together. After the printing element substrate 30 is connected to the circuit board 20, both the printing element substrate 30 and the circuit board 20 may be connected to the support member 40. The support member 40 may include two separate members corresponding to a portion to which the printing element substrate 30 is fixed and a portion to which the circuit board 20 is fixed or may be an integral member. The support member 40 may be integrated to the head main body 11.

The circuit board 20 and the printing element substrate 30 are assembled into the print head 10 by being attached to the head main body 11 along with the support member 40. For example, the support member 40 with the circuit board 20 and the printing element substrate 30 bonded and fixed thereto is attached to the head main body 11 by bonding or the like. The circuit board 20 is folded as depicted in FIG. 1 to locate the connection terminals 27 at a position where the connection terminals 26 can be connected to a connection end of the main body of the printing apparatus which end is not depicted in the drawings.

Figure 12:
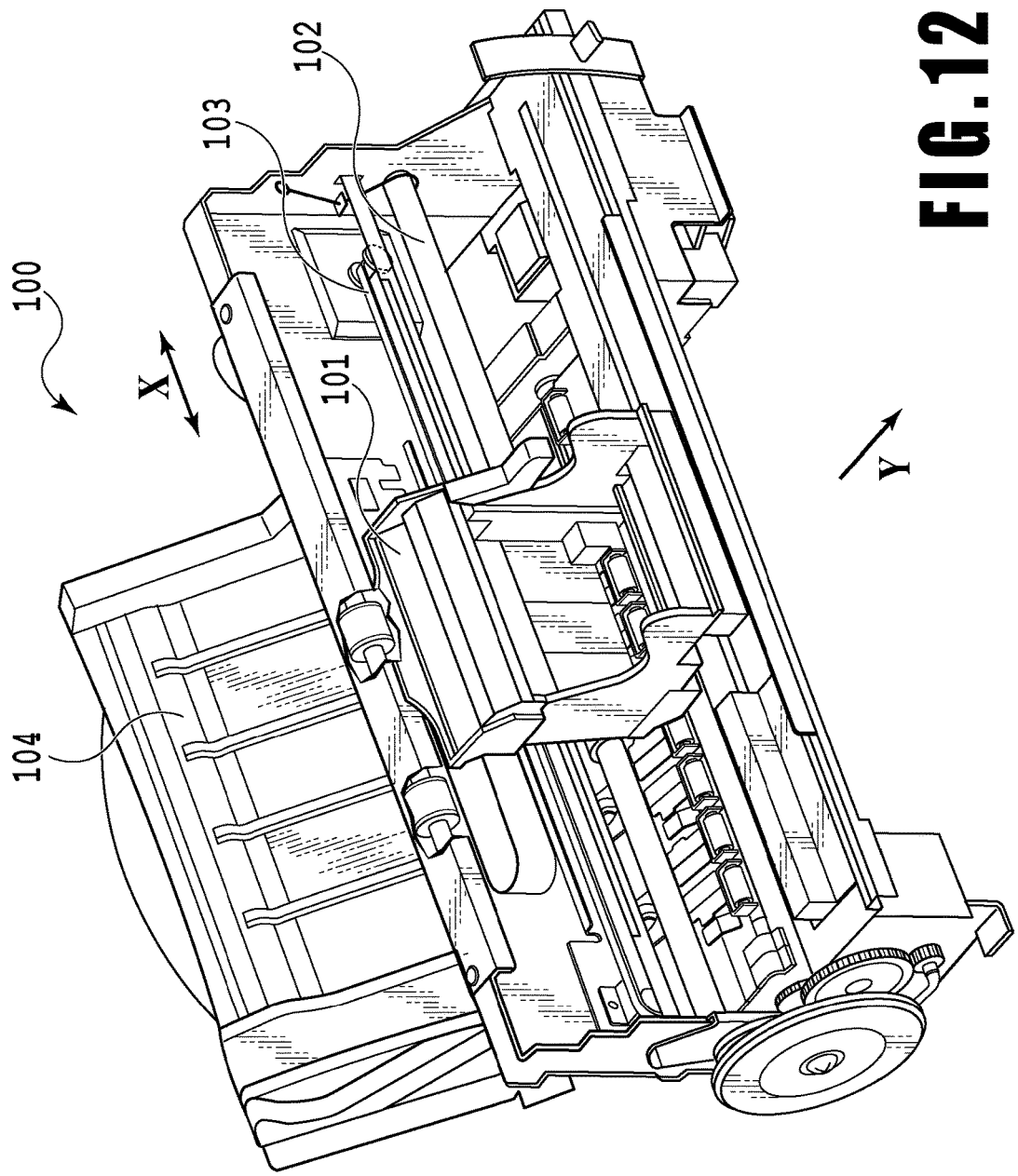
FIG. 12 is a perspective view of a printing apparatus in which the print head in FIG. 1 can be installed.

The print head 10 can be installed on a carriage 101 in a serial-scan ink jet printing apparatus 101 shown in FIG. 12. The print head 10 is installed on the carriage 101 to electrically connect the connection terminals 27 on the circuit board 20 in the print head 10 to connection terminals on the carriage 101 that are not depicted in the drawings. A control section in the printing apparatus 100 that is not depicted in the drawings controls the print head 10 by supplying control signals and driving currents to the print head 10 through these connection terminals. The carriage 101 is guided by a guide shaft 102 so as to be movable in a main scanning direction depicted by arrow X. The print head 10 is moved in the main scanning direction along with the carriage 101 by a moving mechanism including a belt 103. Print media loaded on a tray 104 and not depicted in the drawings are conveyed, by a conveying mechanism including a conveying roller, in a sub-scanning direction that is depicted by arrow Y and that crosses the main scanning direction (in the present example, that is orthogonal to the main scanning direction). The printing apparatus repeats an operation in which the print head 10 ejects ink while moving in the main scanning direction and an operation in which the print medium is conveyed in the sub-scanning direction, to print an image on the print medium.

(Characteristic Configuration)

Figure 4:
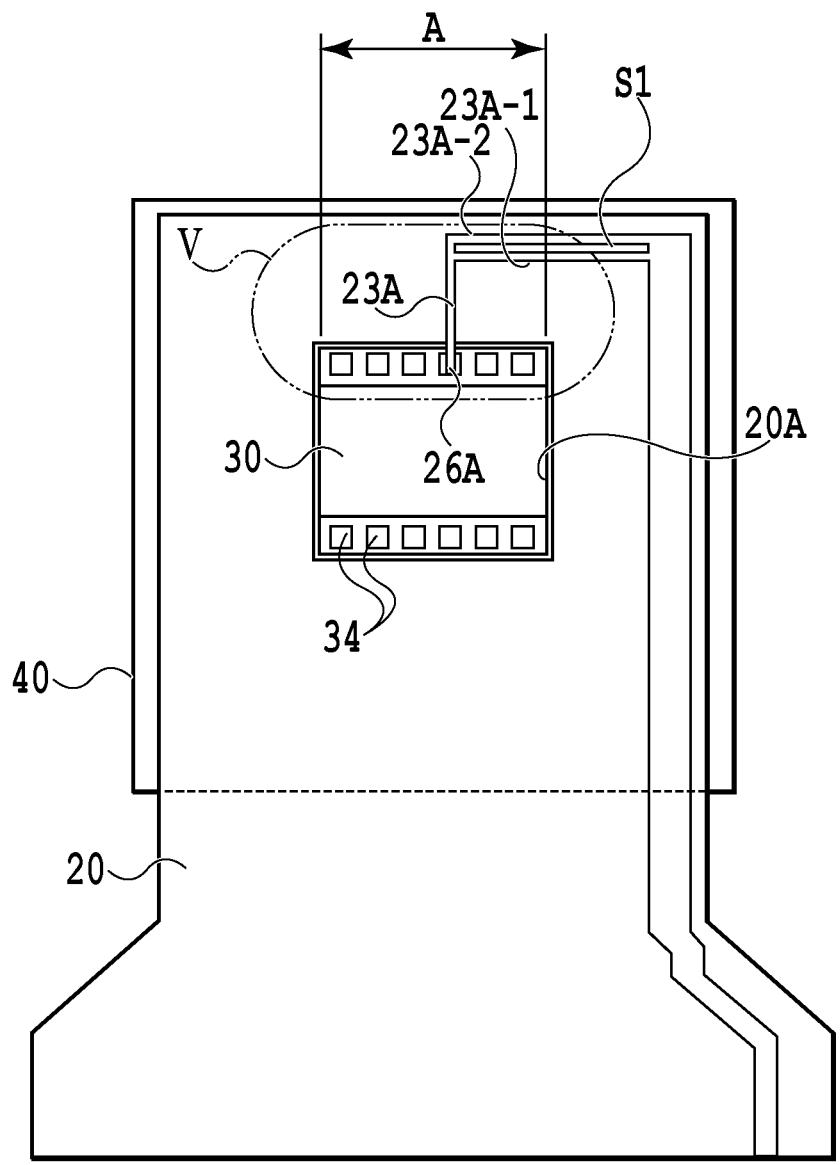
FIG. 4 is a diagram illustrating a circuit board in a first embodiment of the present invention.

FIG. 4 is an enlarged view of an important part of the present embodiment illustrating a characteristic configuration of the present embodiment. FIG. 4 is a perspective view of one typical connection terminal 26A and a corresponding wire pattern 23A. The wire patterns 23 are actually formed on a side of the circuit board 20 that corresponds to a back side of the sheet of FIG. 4.

The wire pattern 23A includes a portion (first portion) extending from a connection terminal 26A in a second direction (upward in FIG. 4) that crosses an arrangement direction (a lateral direction in FIG. 4; first direction) of the electrode terminals 34 (in the present example, the second direction is orthogonal to the arrangement direction). The wire pattern 23A further includes a second portion extending after being bent with respect to the first portion. The second portion is wider than the other wire patterns with a predetermined width in order to suppress wire resistance. In the present example, the wide second portion extends rightward and parallel to the arrangement direction of the electrode terminals 34 and then downward in FIG. 4. The wide portion is divided into two portions 23A-1 and 23A-2 in a width direction of the wide portion, with a slit S1 formed between the two portions. The slit S1 is formed to lie within a connection range A for the electrode terminals 34 and the connection terminals 26. In the present example, the area within the connection range A corresponds to the area within the arrangement range of the electrode terminals 34. The slit S1 is located in a plane to which the adhesive used to bond the circuit board 20 to the support member 40 is applied, in other words, in a bonding plane.

As described above, the surface of the cover film 25 in the circuit board 20, bonded to the support member 40, slightly undulates according to the shape of the wire patterns 23. Thus, when the circuit board 20 and the support member 40 are bonded together with the adhesive, the adhesive is applied to portions of the cover film 25 in an area where the wire pattern 23 is present and to portions of the cover film 25 where the wire pattern 23A is not present. A space between the circuit board 20 and the support member 40 that holds the adhesive applied to the former area is narrower than a space between the circuit board 20 and the support member 40 that holds the adhesive applied to the latter area. Consequently, the adhesive applied to the former area tends to be spread out to the latter area. Furthermore, the adhesive offers flow resistance according to the undulating shape of the surface of the cover film 25.

Figure 5:
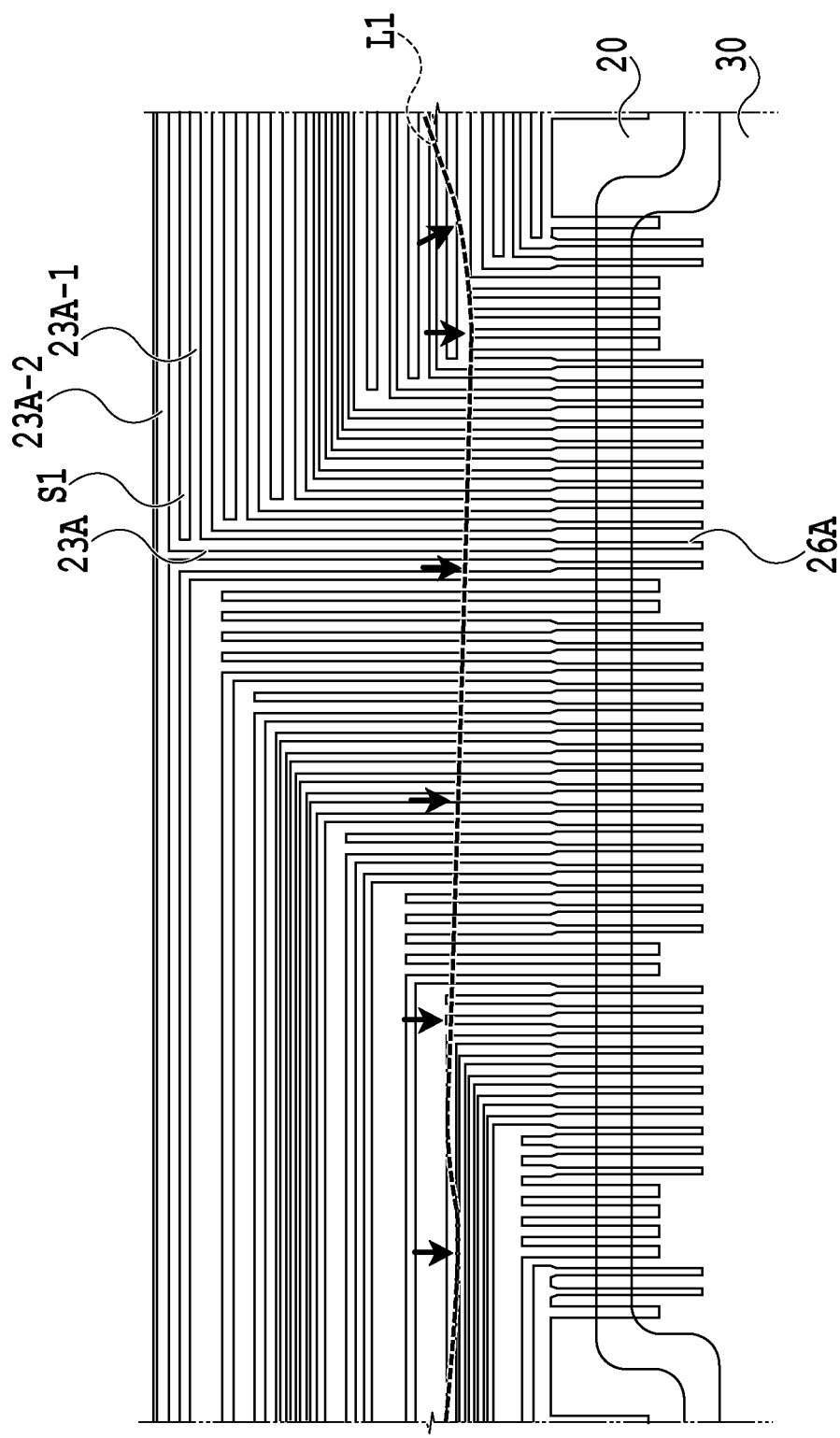
FIG. 5 is a diagram illustrating a specific configuration example of the circuit board in FIG. 4.

In the present embodiment, the slit is formed in the wide portion of the wire pattern so that, when the circuit board 20 and the support member 40 are bonded together with the adhesive, the adhesive can be substantially evenly spread. FIG. 5 is a diagram illustrating spread of the adhesive. The plurality of wire patterns 23 includes a plurality of wire patterns with the slit S1 formed in the wide portion thereof, such as the wire pattern 23A in FIG. 4. FIG. 5 corresponds to an enlarged view of a circular portion V in FIG. 4. When the circuit board 20 and the support member 40 are bonded together, the adhesive spreads from top to bottom in FIG. 5 as depicted by arrows in FIG. 5. Line L1 represents the position of a tip portion of the spread adhesive and corresponds to the range of the spread of the adhesive. The slit is formed in each of the wide portions of the wire patterns to enable the widths of the resultant wire patterns to be made substantially uniform. As a result, the adhesive spread out by the wire pattern 23A can be held by the slit S1. Furthermore, the flow resistance in the spread direction from top to bottom in FIG. 5 can be made substantially uniform to substantially evenly spread the adhesive as depicted by line L1. For example, when the wide portion of the wire pattern is separated into a plurality of portions and a slit with a width of approximately 50 µm is formed between the resultant portions, the width of the wire pattern and the interval between the wire patterns can be set to approximately 50 µm.

Such substantial even spread of the adhesive avoids leakage of the adhesive from bonding areas where the adhesive is likely to spread, to the exterior, and avoids inappropriate bonding in bonding areas where the adhesive is unlikely to spread. Therefore, bonding of the circuit board 20 can be very reliably achieved.

Figure 6:
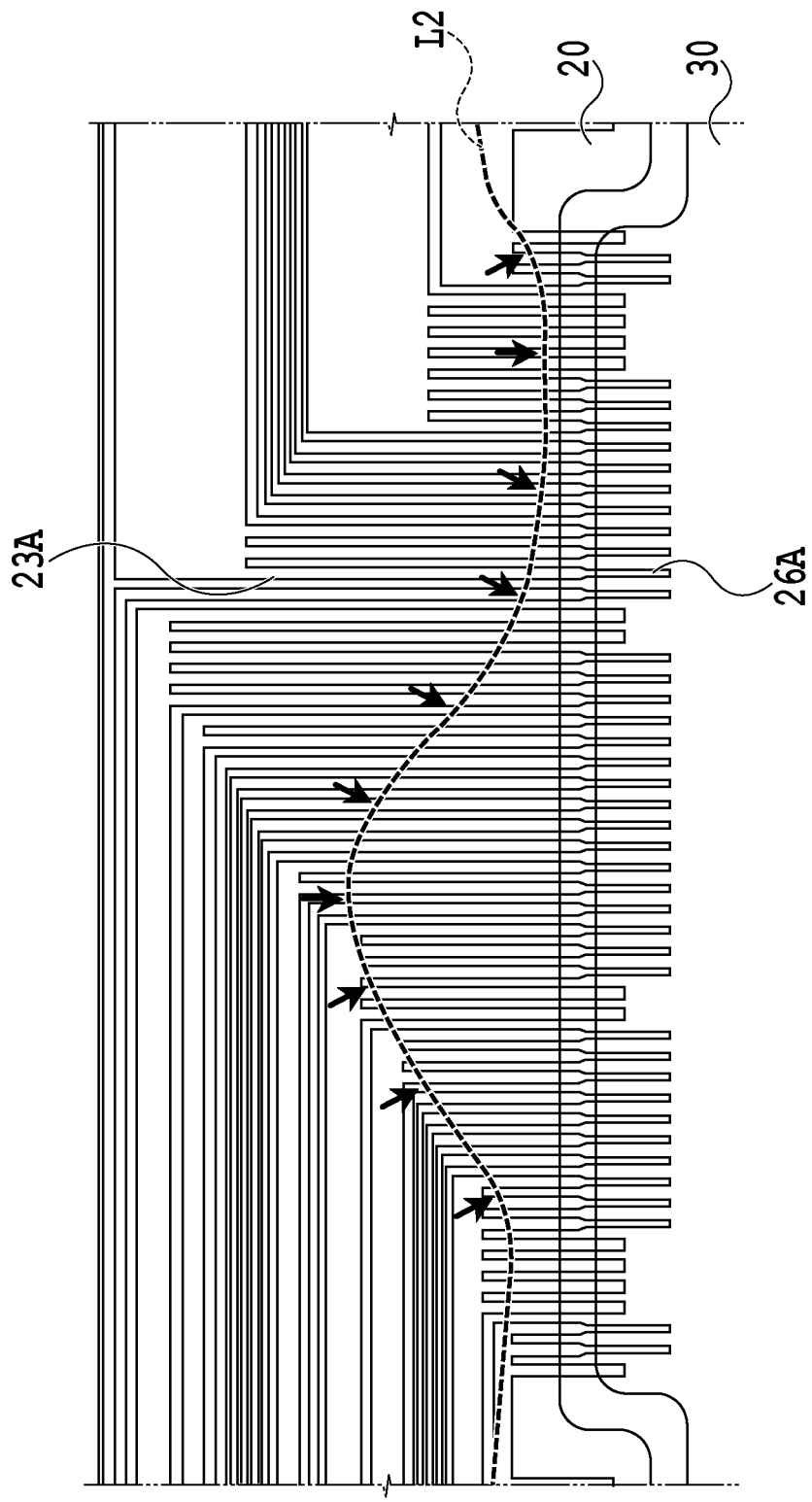
FIG. 6 is a diagram illustrating a circuit board as a comparative example.

FIG. 6 is a diagram illustrating a comparative example. The wire pattern 23A in the comparative example has no slit formed in the wide portion within the connection range A. In the comparative example, a plurality of wire patterns including the wire pattern 23A is brought together into one wide common portion. The plurality of wire patterns 23 in FIG. 6 includes a plurality of wire patterns with no slit formed in the wide portion like the wire pattern 23A. The wide portion of the wire pattern has a narrow space that holds the adhesive between the circuit board 20 and the support member 40. Thus, the adhesive in the wide portion is spread out to the other portion. Furthermore, the adhesive in the wide portion offers weaker flow resistance than the adhesive in the other portion and is thus easily spread out. Consequently, the adhesive is unevenly spread as depicted by line L2 in FIG. 6. This may lead to leakage of the adhesive to the exterior or locally inappropriate bonding.

Second Embodiment

Figure 7:
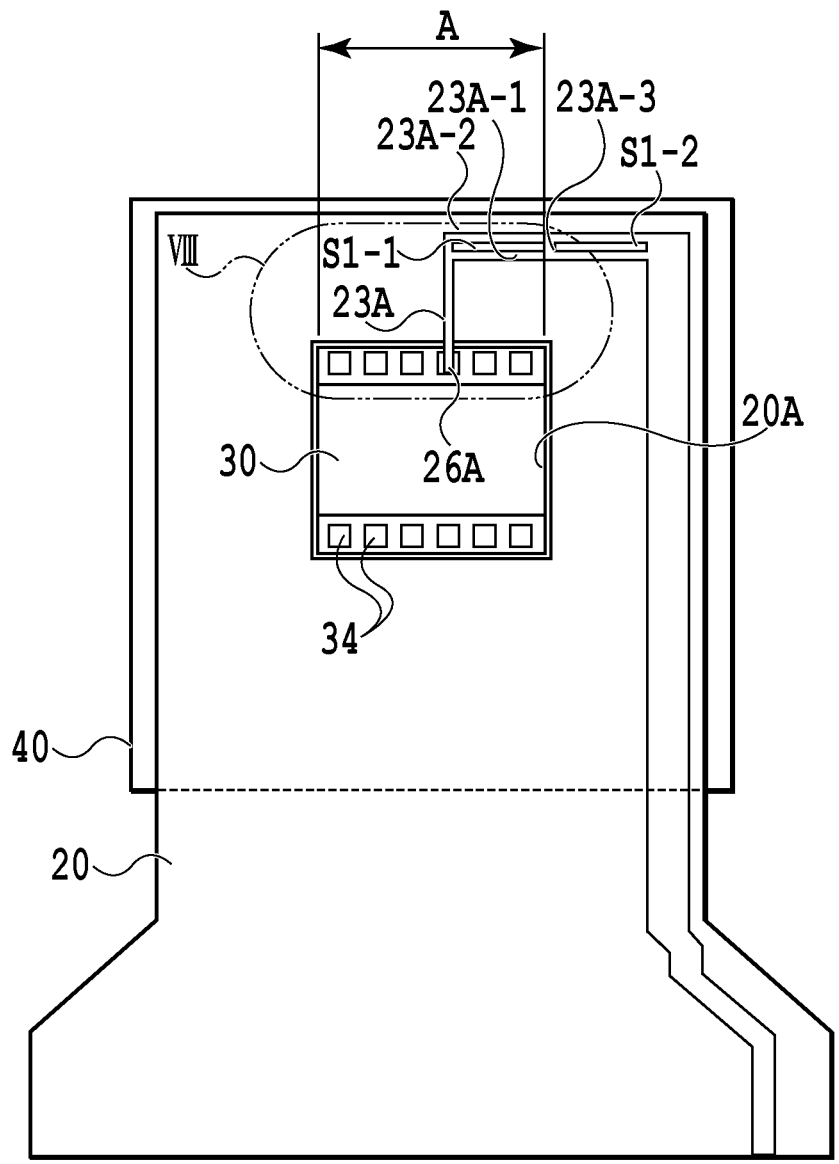
FIG. 7 is a diagram illustrating a circuit board in a second embodiment of the present invention.

In the present embodiment, as depicted in FIG. 7, two slits S1-1 and S1-2 are formed in the wide portion of the wire pattern 23A in the first embodiment. That is, a connection portion 23A-3 that connects portions 23A-1 and 23A-2 by which the wide portion is divided is formed to divide the slit S1 in the first embodiment into two portions. The slit S1 may be divided into two or more portions.

Figure 8:
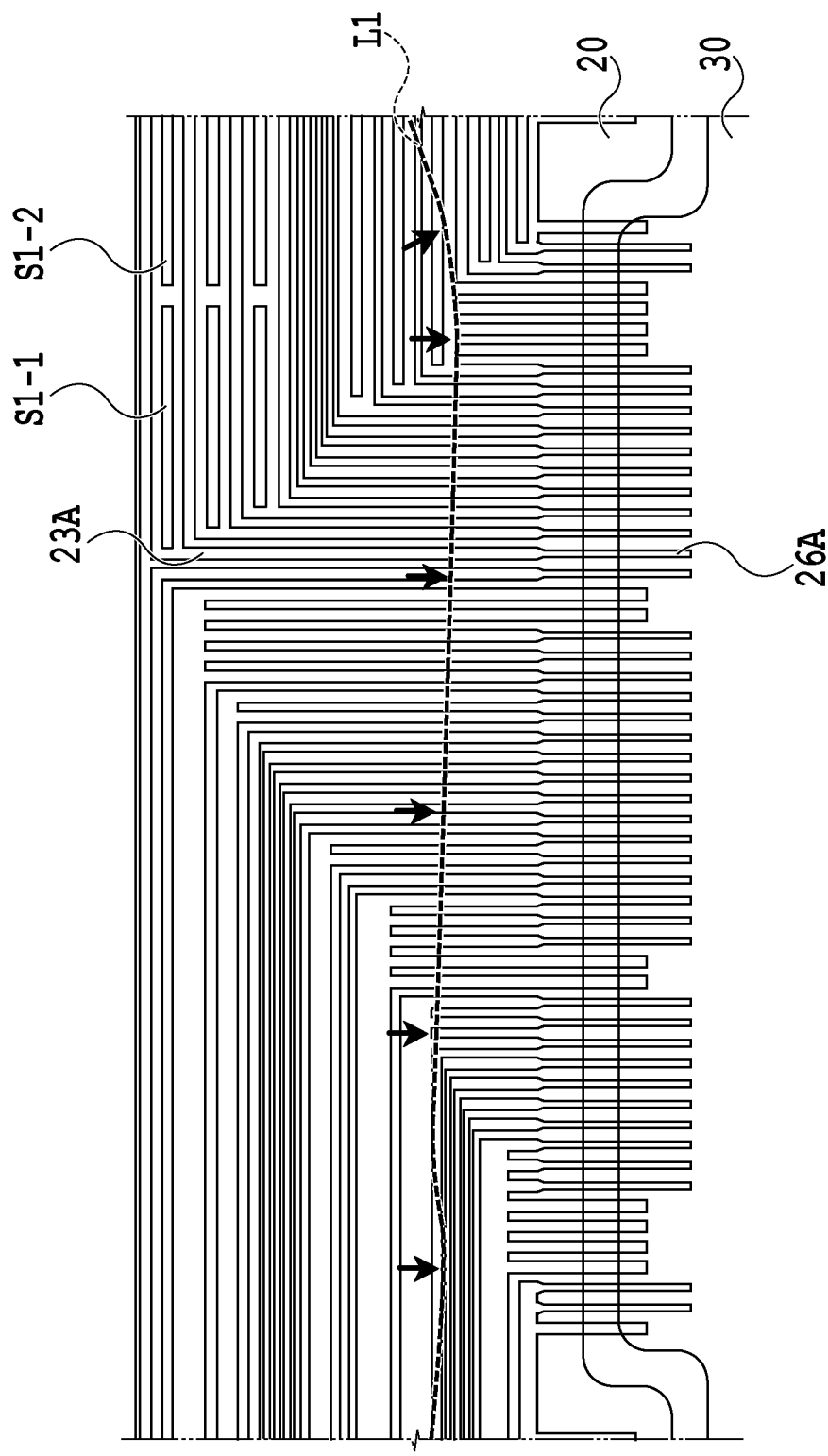
FIG. 8 is a diagram illustrating a specific configuration example of the circuit board in FIG. 7.

FIG. 8 is a diagram illustrating spread of the adhesive. The plurality of wire patterns 23 includes a plurality of wire patterns with the slits S1-1 and S1-2 formed in the wide portion thereof, such as the wire pattern 23A in FIG. 7. FIG. 8 corresponds to an enlarged view of a circular portion VIII in FIG. 7. Like the first embodiment, the present embodiment makes the widths of the resultant wire patterns substantially uniform to allow the adhesive to be substantially evenly spread as depicted by line L1 in FIG. 8.

Third Embodiment

Figure 9:
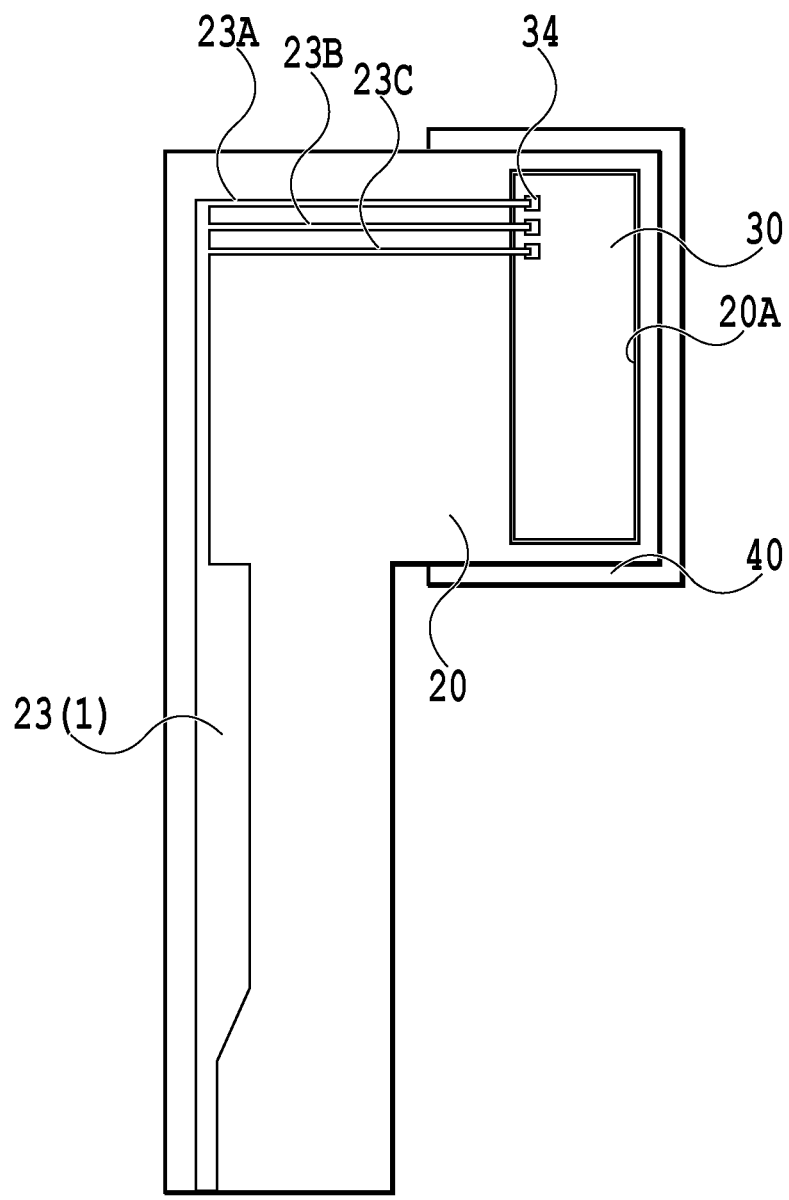
FIG. 9 is a diagram illustrating a circuit board in a third embodiment of the present invention.

In the present embodiment, as depicted in FIG. 9, the plurality of electrode terminals 34 is arranged along an edge of the printing element substrate 30. FIG. 9 is a perspective view of wire patterns 23A, 23B, and 23C corresponding to three typical electrode terminals 34 on the printing element substrate 30. The wire patterns are actually formed on a side of the circuit board 20 that corresponds to a back side of the sheet of FIG. 9.

The wire patterns 23A, 23B, and 23C are brought together into one common wide wire pattern 23 (1) at a position way from the electrode terminals 34 in order to suppress wire resistance. That is, the wire patterns 23A, 23B, and 23C into which the wide wire pattern 23A (1) is divided have a substantial uniform width like the other wire patterns. Like the above-described embodiments, the present embodiment makes the widths of the resultant wire patterns substantially uniform to allow the adhesive to be substantially evenly spread.

Fourth Embodiment

Figure 10:
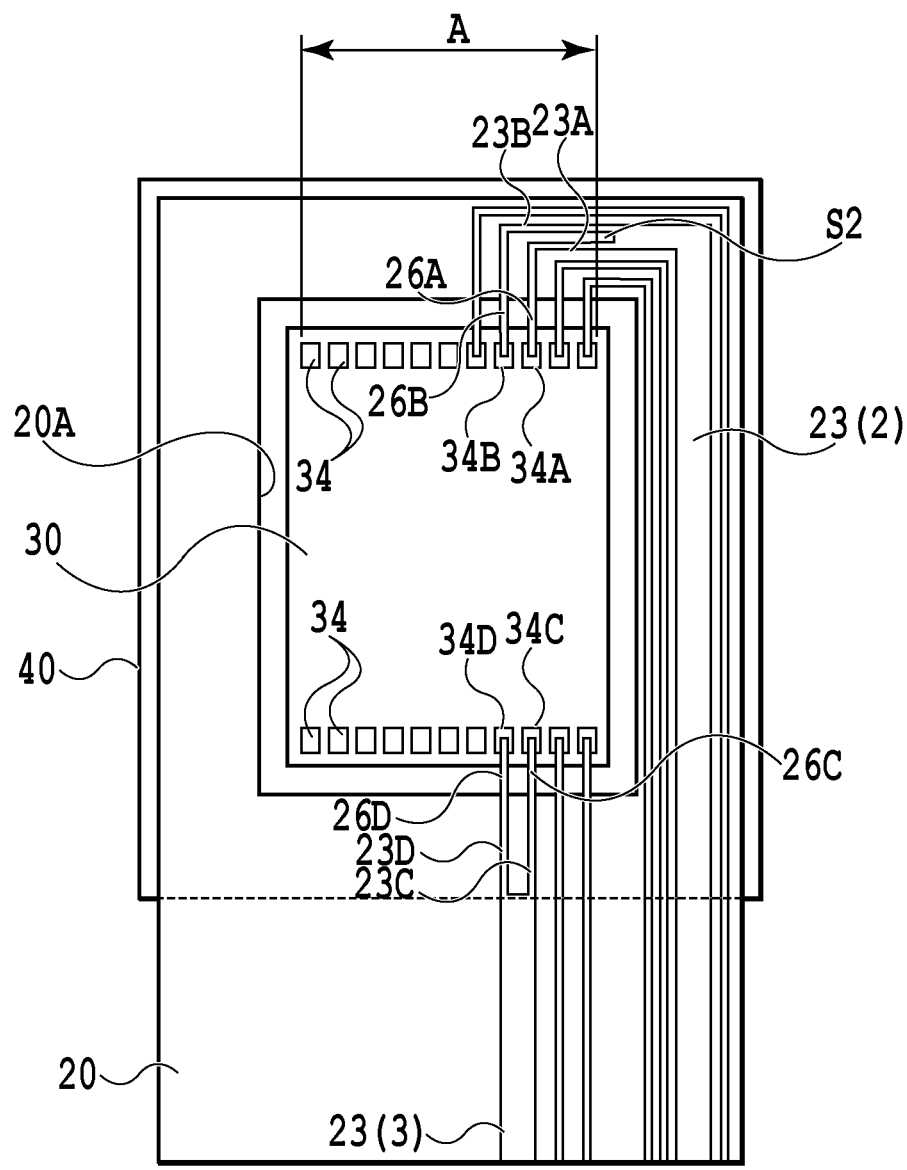
FIG. 10 is a diagram illustrating a circuit board in a fourth embodiment of the present invention.

FIG. 10 is a perspective view of typical wire patterns in the present embodiment. The wire patterns are actually formed on a side of the circuit board 20 that corresponds to a back side of the sheet of FIG. 10.

Wire patterns 23A and 23B corresponding to connection terminals 26A and 26B connected to electrode terminals 34A and 34B are brought together at a position away from the connection terminals 26A and 26B in order suppress wire resistance. The wire patterns 23A and 23B are brought together at a position outside the connection range A for the electrode terminals 34 and the connection terminals 26. Thus, within the connection range A, a slit S2 is formed between the wire patterns 23A and 23B. In the present example, the connection range A corresponds to the arrangement range of the electrode terminals 34. A wire pattern 23 (2) is a wide common wire pattern formed by bringing the wire patterns 23A and 23B together. Similarly, wire patterns 23C and 23D corresponding to connection terminals 26C and 26D connected to electrode terminals 34C and 34D are brought together into a wire pattern 23 (3).

Like the above-described embodiments, the present embodiment makes the widths of the resultant wire patterns substantially uniform to allow the adhesive to be substantially evenly spread.

Fifth Embodiment

Figure 11:
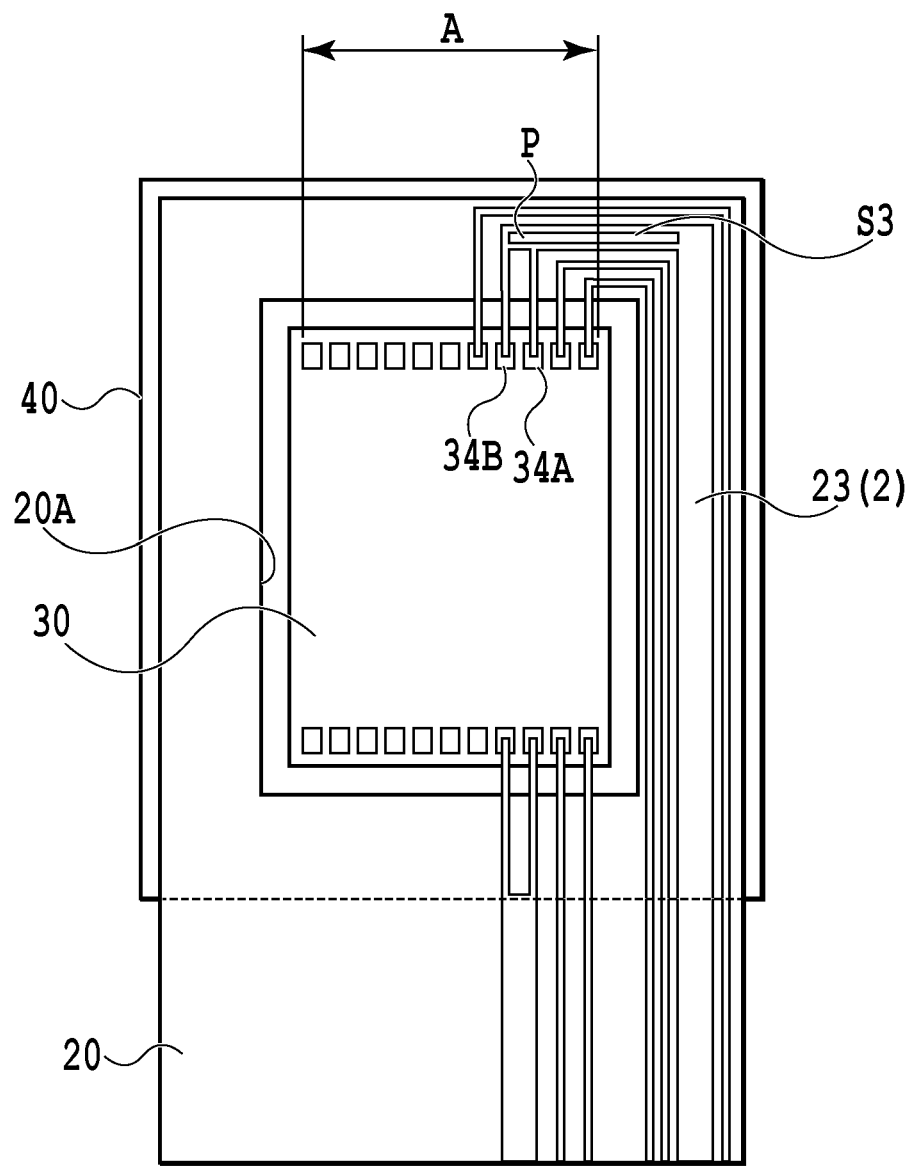
FIG. 11 is a diagram illustrating a circuit board in a fifth embodiment of the present invention.

In the present embodiment, as depicted in FIG. 11, a slit S3 is formed in a portion of a common wide wire pattern 23 (2) positioned within the connection range A. That is, the wire pattern 23 (2) is divided into two portions in the width direction of the wire pattern 23 (2), with the slit S3 formed between these portions. In other words, the slit S3 is formed between a connection portion of the wire pattern 23A and 23B and the two portions into which the wire pattern 23 (2) is divided. The slit S3 makes the widths of the resultant wire patterns substantially uniform. As a result, the adhesive can be substantially evenly spread as is the case with the above-described embodiments.

Other Embodiments

The present invention is not limited to the circuit board for print heads but can be widely utilized as circuit boards connected to various electric components. Furthermore, the print head may form a liquid ejection head that ejects a liquid besides various types of ink. Such a liquid ejection head may be included in a liquid ejection apparatus that executes various processes related to ejection of a liquid.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-107297, filed May 27, 2015, which is hereby incorporated by reference herein in its entirety.

What is claimed is:

1. A circuit board including a plurality of connection terminals arranged along a first direction and a plurality of wire patterns connected to the respective plurality of connection terminals, a surface of the circuit board with the plurality of wire patterns formed thereon being bonded to a support member with an adhesive,
   wherein each of the plurality of wire patterns includes a first portion extending from the connection terminal in a second direction crossing the first direction and a second portion extending after being bent from the first portion,
   the second portion of at least one of the plurality of wire patterns is divided into a plurality of portions in a width direction crossing a direction in which the second portion extends, and
   the second portion divided into the plurality of portions is a common wide portion into which the first portions of at least two of the wire patterns are brought together.

2. The circuit board according to claim 1, wherein the plurality of wire patterns includes a first wire pattern in which the second portion has a predetermined width and a second wire pattern in which the second portion has a width larger than the predetermined width, and
   the second portion of the second wire pattern is divided into a plurality of portions in the width direction.

3. The circuit board according to claim 1, wherein the second portion divided into the plurality of portions is positioned in a bonding surface of the circuit board.

4. The circuit board according to claim 1, wherein the second portion divided into the plurality of portions is positioned within an arrangement range of the plurality of connection terminals in the first direction.

5. The circuit board according to claim 1, wherein the second direction is orthogonal to the first direction, and
   the second portion is bent in the first direction from the first portion.

6. The circuit board according to claim 1, wherein the plurality of connection terminals is arranged along an edge of the circuit board.

7. The circuit board according to claim 1, wherein the circuit board is a flexible circuit board.

8. A circuit board including a plurality of connection terminals arranged along a first direction and a plurality of wire patterns connected to the respective plurality of connection terminals, a surface of the circuit board with the plurality of wire patterns formed thereon being bonded to a support member with an adhesive,
   wherein each of the plurality of wire patterns includes a first portion extending from the connection terminal in a second direction crossing the first direction and a second portion extending after being bent from the first portion,
   the second portion of at least one of the plurality of wire patterns is divided into a plurality of portions in a width direction crossing a direction in which the second portion extends, and
   the second portion divided into the plurality of portions has a slit extending in a length direction of the second portion.

9. The circuit board according to claim 8, wherein the slit is divided into a plurality of portions in the length direction of the second portion.

10. A liquid ejection head enabled to eject a liquid, the liquid ejection head comprising a circuit board and an element substrate, wherein the circuit board includes a plurality of connection terminals arranged along a first direction and a plurality of wire patterns connected to the respective plurality of connection terminals, a surface of the circuit board with the plurality of wire patterns formed thereon being bonded to a support member with an adhesive, each of the plurality of wire patterns includes a first portion extending from the connection terminal in a second direction crossing the first direction and a second portion extending after being bent from the first portion, the second portion of at least one of the plurality of wire patterns is divided into a plurality of portions in a width direction crossing a direction in which the second portion extends, the element substrate includes a plurality of electrode terminals connected to the plurality of connection terminals on the circuit board, and the second portion divided into the plurality of portions is a common wide portion into which the first portions of at least two of the wire patterns are brought together.

11. A liquid ejection head enabled to eject a liquid, the liquid ejection head comprising a circuit board and an element substrate, wherein the circuit board includes a plurality of connection terminals arranged along a first direction and a plurality of wire patterns connected to the respective plurality of connection terminals, a surface of the circuit board with the plurality of wire patterns formed thereon being bonded to a support member with an adhesive, each of the plurality of wire patterns includes a first portion extending from the connection terminal in a second direction crossing the first direction and a second portion extending after being bent from the first portion, the second portion of at least one of the plurality of wire patterns is divided into a plurality of portions in a width direction crossing a direction in which the second portion extends, the element substrate includes a plurality of electrode terminals connected to the plurality of connection terminals on the circuit board, and the second portion divided into the plurality of portions has a slit extending in a length direction of the second portion.

* * * * *